US011507717B2

(12) United States Patent
Fuerstenberg et al.

(10) Patent No.: US 11,507,717 B2
(45) Date of Patent: Nov. 22, 2022

(54) DETERMINING ONE OR MORE CHARACTERISTIC VALUES AND SIMULATING TRAFFIC FOR AN AUTONOMOUSLY TRAFFICABLE ENVIRONMENT

(71) Applicant: SICK AG, Waldkirch/Breisgau (DE)

(72) Inventors: Kay Fuerstenberg, Freiburg (DE); Christoph Reinke, Hamburg (DE); Patric Beinschob, Hamburg (DE); Christoph Hansen, Hamburg (DE); Georg Plasberg, Bahlingen am Kaiserstuhl (DE); Martin Wüstefeld, Sexau (DE)

(73) Assignee: SICK AG, Waldkirch (DE)

( * ) Notice: Subject to any disclaimer, the term of this patent is extended or adjusted under 35 U.S.C. 154(b) by 486 days.

(21) Appl. No.: 16/535,363

(22) Filed: Aug. 8, 2019

(65) Prior Publication Data
US 2020/0050719 A1 Feb. 13, 2020

(30) Foreign Application Priority Data
Aug. 9, 2018 (DE) .......................... 102018119397.1

(51) Int. Cl.
*G06F 30/20* (2020.01)
*G05D 1/00* (2006.01)

(52) U.S. Cl.
CPC ........... *G06F 30/20* (2020.01); *G05D 1/0088* (2013.01); *G05D 2201/0216* (2013.01)

(58) Field of Classification Search
CPC ................. G06F 30/20; G05D 1/0088; G05D 2201/0216
See application file for complete search history.

(56) References Cited

U.S. PATENT DOCUMENTS

2016/0144505 A1* 5/2016 Fong .................... B25J 9/1697
 700/250
2017/0358201 A1* 12/2017 Govers ............... G05D 1/0248

FOREIGN PATENT DOCUMENTS

DE 102006059829 A1 6/2008

OTHER PUBLICATIONS

Sabattini L, Cardarelli E, Digani V, Secchi C, Fantuzzi C, Fuerstenberg K. Advanced sensing and control techniques for multi AGV systems in shared industrial environments. In2015 IEEE 20th Conference on Emerging Technologies & Factory Automation (ETFA) Sep. 8, 2015 (pp. 1-7). IEEE. (Year: 2015).*

(Continued)

*Primary Examiner* — Chuen-Meei Gan
(74) *Attorney, Agent, or Firm* — Nath, Goldberg & Meyer; Jerald L. Meyer (57) ABSTRACT

A method of determining one or more characteristic values for an environment automatically trafficable by vehicles comprises the steps: providing a spatially resolving, electronically usable representation of the environment; providing parameters that describe properties of vehicles and of the traffic in the environment; simulating the traffic in the environment with reference to the electronically usable representation of the environment and with reference to the parameters provided; in the simulation, detecting and counting events of interest, detecting and counting events of interest, determining the characteristic values with reference to the counter result, and outputting and/or storing the characteristic value.

19 Claims, 7 Drawing Sheets

(56) References Cited

OTHER PUBLICATIONS

Ferreira T, Gorlach IA. Development of an automated guided vehicle controller using a model-based systems engineering approach. South African journal of industrial engineering. Aug. 2016;27(2):206-17. (Year: 2016).*

Sabattini L, Aikio M, Beinschob P, Boehning M, Cardarelli E, Digani V, Krengel A, Magnani M, Mandici S, Oleari F, Reinke C. The pan-robots project: Advanced automated guided vehicle systems for industrial logistics. IEEE Robotics & Automation Magazine. Nov. 10, 2017;25(1):55-64. (Year: 2017).*

Gerkey B P et al: "The player/stage project: tools for multi robot and distributed sensor systems", Proceedings of th 11th international conference on advanced robotics: Jun. 30-Jul. 3, 2003, University of Coimbra, Portugal, Jan. 1, 2003, pp. 317-323, XP 009163748.

Damjan Miklic et al: "A modular control system for warehouse automation—algorithms and simulations in USARSim", Robotics and automation (ICRA), 2012 IEEE International Conference on, IEEE, May 14, 2012, p. 3449-3454, XP 032450625, DUI: 10.1109/ICRA.2012.6224894, ISBN: 987-1-4673-1403-9.

Damjan Miklic et al: "A control architecture for warehouse automation—Performance evaluation in USARSim", Robotics and automation (ICRA), 2011 IEEE International Conferenceon, IEEE, May 9, 2011, pp. 109-114, XP 032033835, DUI: 10.1109/ICRA.2011.5979972, ISBN: 978-1-61284-386-5.

Kelen C T Vivaldini et al: "Robotic forklifts for intelligent warehouses: Routing, path planning, and auto-localization", Industrial Technology (ICIT), 2010 IEEE International Conference on, IEEE, Piscataway, NJ, USA, Mar. 14, 2010, pp. 1463-1468, XP 031680952, ISBN: 978-1-4244-5695-6.

European Search Report dated Nov. 21, 2019 corresponding to application No. 19190343.4-1222.

Office Action dated Aug. 11, 2020 issued in corresponding German Application No. 102018119397.1.

* cited by examiner

DETERMINING ONE OR MORE CHARACTERISTIC VALUES AND SIMULATING TRAFFIC FOR AN AUTONOMOUSLY TRAFFICABLE ENVIRONMENT

The invention relates to a method and to an apparatus for determining one or more characteristic values for an environment autonomously trafficable by vehicles. The invention additionally relates to a method of simulating traffic for an environment autonomously trafficable by vehicles, in particular in or for a method of the above-specified kind.

A warehouse can be imagined as an example for such an environment within which automated guided vehicles transport, pick, place, and rearrange stock products and to move them into and out of the warehouse. The transport can primarily take place in the plane (preferably as horizontal and planar, assumed as an x-y plane), but can also take place vertically (z direction), for instance by means of an autonomous forklift truck or similar. Such properties can be comparatively large and have a floor space of many 1,000 to some 10,000 square meters. A large number of automated guided vehicles can be in transit in them. In addition to automated guided vehicles, vehicles conventionally operated by persons and also pedestrians can also be present therein.

The movement of a robot or of a robot arm in an environment can be imagined as a further example. The robot arm is then the vehicle and the environment has different other objects, for instance a product to be produced, a small goods store, another (movable) robot arm, one or more persons, or other stationary or moving obstacles and similar.

Figure 3:
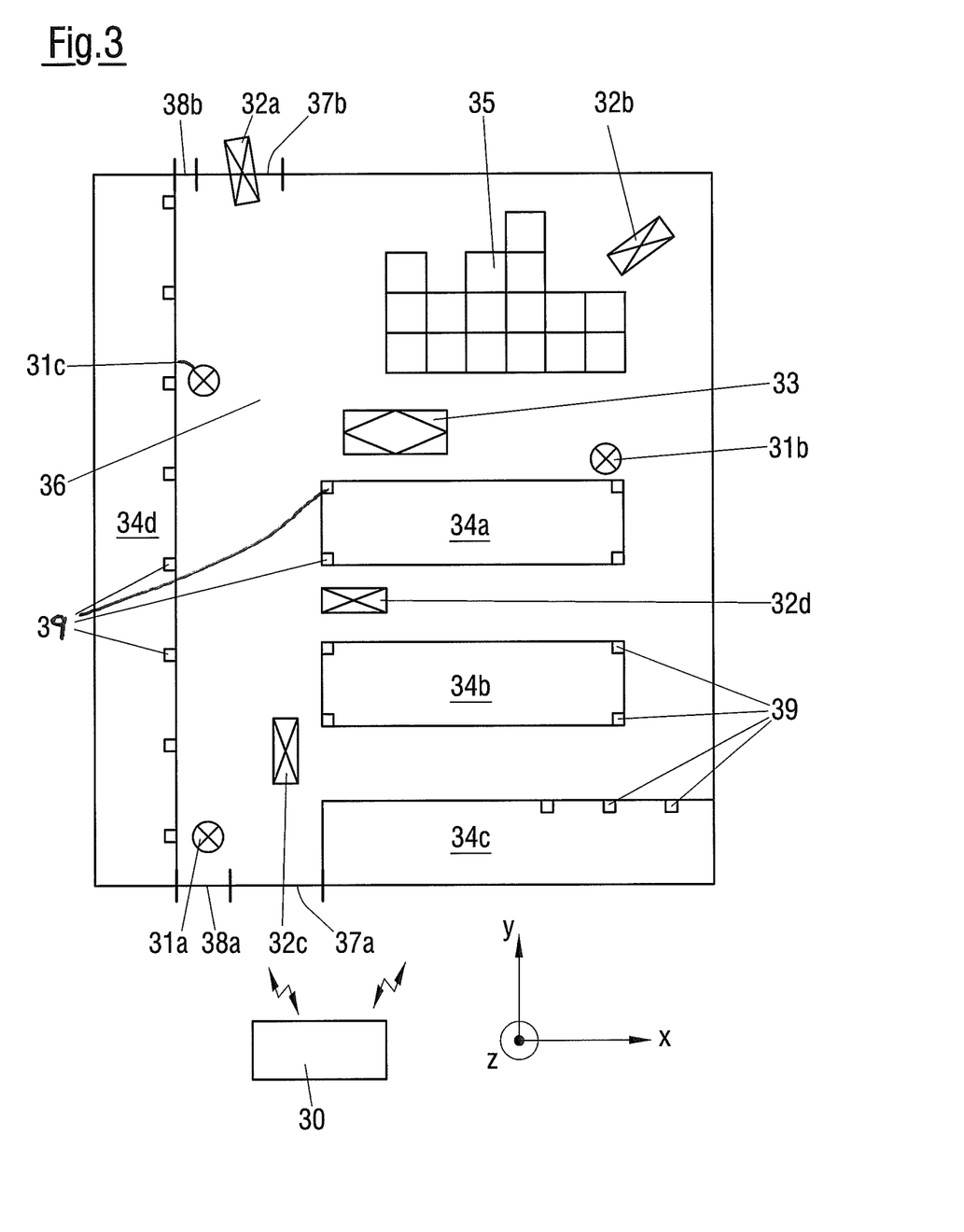
FIG. 3 by way of example, an environment for which and in which the method can be used.

FIG. 3 schematically shows a possible constellation in a plan view. A storage space having a trafficable area 36 is assumed. Doors that can be driven through are indicated by 37a and 37b. Doors for persons are indicated by 38a and 38b. Structures 34a, 34b, 34c, and 34d are stationary racks for storing goods. 35 indicates a free store, that is areas on which goods can be freely placed and which are then trafficable or not trafficable according to the occupation state. Active and/or passive navigation aids that serve for the navigation and orientation of the automated guided vehicles 32 are marked by 39. They can be passive reflectors for an optical detection or active sensors that can detect the environment two-dimensionally or three-dimensionally and that can transfer their detection results to a central computer 30 in a wireless or wired manner. This computer 30 is in turn connected to the automated guided vehicles 32. The communication between the navigation aids 39 and the autonomous vehicles 32 can, however, also take place directly wirelessly instead of via a central computer 30. Passive navigation aids can be attached to obstacles (for example to racks 34) or can also be trafficable markings on the floor.

FIG. 3 shows four automated guided vehicles 32a, 32b, 32c, and 32d. A vehicle conventionally operated by a person is marked by 33, for instance a fork-lift truck or a bicycle or similar. Finally, persons who may be in the warehouse are marked by 31a-c.

The automated guided vehicles 32 bring goods from outside into the warehouse and place them on a rack 34 there or on the free area 35 and/or pick up goods from there and take them out of the warehouse and/or carry out rearrangements within the warehouse or simply drive through.

Figure 4:
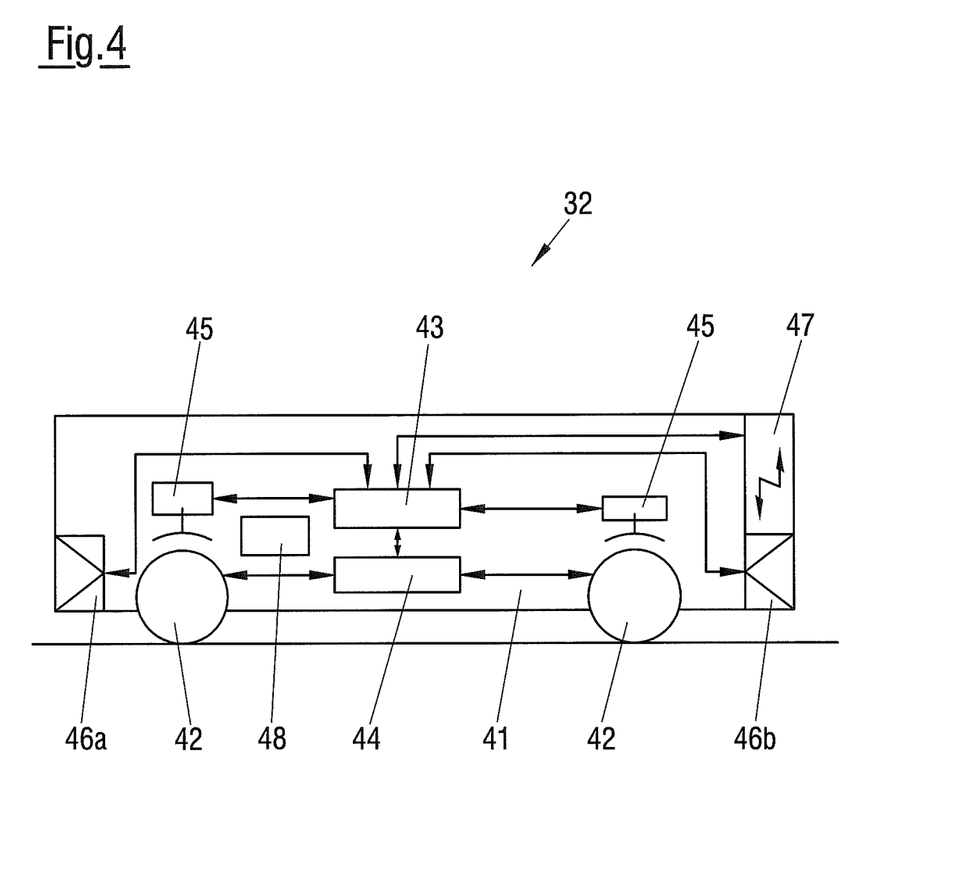
FIG. 4 by way of example, schematically, an autonomously navigating vehicle.

To be able to drive autonomously, the vehicles 32 are equipped with various sensors and other control devices. FIG. 4 shows this systematically. A central control is indicated by 43 there that receives signals from the sensor system 46a, 46b and outputs them to the actuator system 44, 45. The control 43 is furthermore connected to a wireless communication connection 47 by means of which it can communicate with other vehicles or with a central computer 30. The actuator system can comprise the vehicle drive 44 and/or brakes 45 and/or steering and the like. The sensor system can have internal sensor systems (speed sensor, acceleration sensor, . . . ) and an environmental sensor system that can scan and detect the environment around the vehicle two-dimensionally or three-dimensionally.

The described environmental sensor system can be a spatially resolving distance sensor system that makes the environment detectable, for instance by means of LIDAR (light detection and ranging) or LADAR (laser detection and ranging) or by RADAR, in that the spatial resolution of this sensor system can be comparatively fine and can be in the range of one centimeter or a few centimeters. A plurality of these environmental sensors are typically provided to, on the one hand, be able to completely detect the environment of the vehicle and to, on the other hand, have redundancies for the case that one of the sensors fails and for cross-checks.

Autonomous driving in an environment takes place with reference to an electronically usable representation of the environment that represents the environment in a spatially resolved or spatially resolving manner. Such a representation will also briefly be called a "map" or an "electronic map" in the following. With respect to the situation of FIG. 3, such an environmental representation/map/electronic map could at least store the ground plan of the space, the racks 34 therein, the positions of the doors 37 and 38 and, optionally, also the positions of the navigation aids 39.

In contrast, area occupations, for instance in the free store 35 or by instantaneously present pedestrians or other vehicles are at least initially not included. It is, however, possible using certain map updating algorithms that such transient movements are also entered into a map, optionally with statistical weighting.

The spatial resolution of the map corresponds to the necessities and can be in the centimeter or millimeter range. The environment of a robot arm can also be mapped as described.

If a simulation is to be carried out, a starting state or an instantaneous state in the environment to be simulated can be taken and can be further calculated recursively/iteratively in a number of time-discrete steps. The instantaneous state can be described, on the one hand, by the electronic map and, on the other hand, by data that describe the behavior of mobile objects and of other objects in the environment. In particular, data tuples of position and orientation, linear speed, angular speed, linear acceleration, angular acceleration, size, and further data can exist for every autonomous vehicle 32, for every guided vehicle 33, and for every pedestrian 31. A given situation (starting situation) can be further calculated into an end state after a specific time period by them, with such a time period being able to be comparatively short, for instance one second or one or more tenths of a second or even shorter. To this extent, the simulation can take place iteratively, that is such that a calculated end state is taken as a new starting state and is further calculated from there until an internal or external abort criterion for the simulation is present.

At the same time, simulated interventions can occur, for instance in that simulated steering wheel turns are changed or in that simulated detections indicate an approach to another object that makes an intervention necessary. To this extent, the simulation, on the one hand, therefore detects the normal physical dynamics of moving bodies, but, on the other hand, also interventions that are necessary to carry out jobs and to ensure the safety of the autonomous driving. The simulation therefore also comprises safety-relevant aspects such as collision prevention and thus also sensor system simulation, actuator system simulation and similar. This in turn all depends on different parameters.

Different measures are taken to ensure the safety of autonomous driving. The kind and the extent, however, depend on the respective site of operation and also on the applicable regulations. Safety relevant parameters comprise:

hardware redundancy: The sensor system is present in a dual overlapping manner to be able to compensate a failure of a sensor. This applies in a similar manner to actuator systems (brakes);

type of sensor. Sensors can have different resolutions. The data volume to be processed increases in accordance with the resolution. If the detection takes place in three-dimensional space, the data volume increases quadratically with the resolution. The required processing power also increases in accordance with the data volume;

setting of top speeds below the technically possible speed to be regulated;

setting of protected fields and warning fields around the vehicle. If objects are unexpectedly recognized therein, specific measures follow;

redundancy against failure in control and in computing power; and redundancy and bandwidth in the set up communication interfaces to other vehicles and to central components.

Since the specific effects of individual ones of these measures on the safety behavior of the total system are unknown in many cases, the system design is currently frequently set to maximum safety. This is in part also required due to a lack of other sustainable specifications by insurance companies and similar. This then, on the one hand, together leads to expensive hardware and, on the other hand, due to the large number of safety checks and strict parameters to a disrupted and slow routine.

One remedy for this is the long-term observation of traffic situations existing in reality and based on this the adapted setting up of the equipment of the autonomously trafficable environment. This is, however, time-consuming and can take up a number of months up to a year and is also labor-intensive and thus cost-intensive.

It is accordingly the object of the invention to provide a method and an apparatus for determining one or more characteristic values for an autonomously navigable environment that enable the fast and demonstrable determination of such characteristic values.

This object is satisfied by the features of the independent claims.

Such a method of simulating traffic for an environment autonomously trafficable by vehicles may comprise the steps of:

providing a spatially resolving, electronically usable representation of the environment;

providing parameters that describe properties of vehicles and summary properties of the traffic to be simulated in the environment; and simulating the traffic in the environment with reference to the electronically usable representation of the environment and with reference to the parameters provided;

wherein the providing of parameters that describe summary properties of the traffic to be simulated in the environment comprises the following steps:

detecting real parameters that summarily describe real traffic in a real environment; and deriving the parameters that describe summary properties of the traffic to be simulated in the environment from the real properties.

A method of determining one or more characteristic values for an environment autonomously trafficable by vehicles, may comprise the steps of:

providing a spatially resolving, electronically usable representation of the environment;

providing parameters that describe properties of vehicles and summary properties of the traffic to be simulated in the environment;

simulating the traffic in the environment with reference to the electronically usable representation of the environment and with reference to the parameters provided;

in the simulation, detecting events of interest and counting same;

determining the characteristic value or characteristic values with reference to the count result; and outputting and/or storing the characteristic value or characteristic values.

In a method of determining one or more characteristic values of an autonomously trafficable environment, an electronic map is first provided. Parameters are furthermore provided that describe properties of vehicles to be simulated and summary properties to be simulated of the total traffic to be simulated in the environment. The traffic in the environment is simulated with reference to the map and to the parameters. The detection of events of interest and the counting thereof take place in the simulation. The desired characteristic value or values last stored and/or output is/are determined using the counter result.

The characteristic values determined can be an environmental evaluation and/or driving parameters for vehicles, for instance parameter definitions such as protected field definitions and warning field definitions or hardware equipment of a vehicle, and/or changes to the electronic map that can be understood as a proposal to change the real environment.

One kind of characteristic value determination can be optionally to generate spatially resolving evaluation figures that describe the environment to have a characteristic for the environment. Count values alone can be sufficient for this. Relative or related values can, however, also be generated, for instance said values related to a (simulated) year and to a vehicle. If, for example, ten years of operation with 100 vehicles (that is 1,000 vehicle years) were simulated and if three injuries to a person were detected, this produces a coefficient of 0.003 injuries to a person per vehicle and year.

A plurality of characteristic values can be generated, for instance relative frequency of injuries to a person, relative frequency of damage to property, relative frequency of critical situations, and similar. The characteristic values for describing the autonomously trafficable environment then form a data tuple of a plurality of numbers that preferably represent relative characteristic values and that deliver an absolutely usable and relatively easily comparable indication for the environmental properties shown thereby.

By defining and counting events of interest during the simulation and with a suitable definition of these events with respect to the desired statements on safety, just these properties can be recognized and quantified.

The simulation can be a time-discrete, iterative simulation of the movement of the individual objects including autonomous vehicles, an operator-driven vehicle, and pedestrians. The timing (increment on the time axis) can be in the range of seconds or tenths of seconds. The "acceleration" of the simulated traffic behavior with respect to the real traffic depends highly on the involved computer power and on the size of the environment to be simulated or on the number of vehicles/persons to be simulated. It can, however, be assumed that, for example, an acceleration of the simulation with respect to reality by a factor of 100,000 can be achieved. This means that one real day (with 88,400 seconds) can be simulated in less than one second and that, for example, a whole year of traffic can be simulated in approximately five minutes. Ten years of traffic can then be simulated in less than one hour. Statistically significant values can then be produced over such a long simulated time period, namely initially count values of events of interest in the simulation.

"Automated or autonomous driving" in the sense of this description can mean that a vehicle travels under remote control, that is it receives its commands relating to dynamics (brake, accelerate, steer, continue constantly, . . . ) from a remote point (e.g. a central control), preferably wirelessly and in accordance with data that describe the instantaneously current situation in the trafficked environment in real time. These data can be detected by the vehicle itself and can be forwarded and/or can originate from other data sources. It can also mean that a vehicle drives autonomously, that is independently moves to a destination and itself generates its commands required for this purpose and relating to the dynamics in accordance with said data. Autonomous driving can also be a mixed form of remote-controlled and autonomous driving. It can be driverless or with a supervising person.

Different kinds of events of interest can be defined and the counting can take place separately for each of the kinds. Kinds can, for instance, be freely moving traffic, slow-moving traffic, traffic jam, critical situation without damage, property damage, injury to a person, protected field infringement, warning field infringement, occurrence of crushing points, plan preparation, plan change, and the like. Crushing points are points at which the distance between any vehicle part and a surrounding object falls below a certain predefined minimum amount (for instance 40 cm or 30 cm) so that a crushing of a person would probably occur if a person were there. They can be monitored in addition to and independently of protected fields and warning fields and can be counted as events of interest on their arising.

The above definitions can result in double counts (protected field infringement also as a warning field infringement and/or as an arising of a crushing point). If desired, this can be monitored in the simulation and can be precluded by prioritized counting of one event with respect to another event also occurring).

Freely moving, slow-moving traffic or a traffic jam can, for instance, be distinguished with reference to speed ranges. The counting of events of interest can be event controlled here (for instance on a recognition of a simulated collision as property damage) or time-controlled (for example once per second) or route controlled (for example once per meter) or also position controlled.

The events of interest are detected in the simulation in that suitable evaluation algorithms evaluate the respective data of the simulated movements. The count values are then counted up separately for the respective kind of event of interest. They can naturally reach considerably different counts (freely moving traffic high, slow-moving traffic, traffic jam less high, job preparation high in accordance with traffic conditions, order change low, critical situation/near miss, vehicle damage, injury to a person low).

The count values can then be further processed to form the desired characteristic values or can serve as an abort criterion for a simulation and/or as an evaluation of one or more parameters of the simulation.

The simulation takes place with reference to at least one vehicle parameter and traffic parameter. Vehicle parameters can include feature parameters of a vehicle and dynamic parameters of a vehicle. All these parameters enter into the simulation in that their effects on the vehicle movement are simulated.

The feature parameters of a vehicle can include sensor system properties, optionally with associated error probabilities, in particular redundancy of the sensor system and spatial resolution of the sensor system, actuator system properties, optionally with associated error probabilities, in particular steering behavior, braking behavior, acceleration behavior, control properties, optionally with associated error probability, in particular redundancy of the control, error frequency, communication properties, optionally with associated error probabilities, in particular redundancies of the equipment, connection stability, connection quality, connection speed. The breakdown of the communication with other vehicles or with a central control (simulated) can, for example, result in a (simulated) slowing down or plan change or similar to, for instance, simulate a failsafe behavior. (Simulated) control errors can, for example, result in unsuitable control interventions that is, for instance incorrect steering. Actuator system errors can be braking errors, for example. Sensor system properties or sensor system errors can include an incorrect detection of the environment, optionally also a sensor failure with accompanying failsafe strategies and similar. These events can also be simulated and can result in events of interest that are then counted.

The vehicle parameters may comprise one or more of the following parameters:

equipment parameters of a vehicle, in particular one or more of sensor system properties, optionally with sensor system defect probabilities;

actuator system properties, optionally with actuator system defect probabilities;

control properties, optionally with control probabilities;

communication properties, optionally with communication defect probabilities;

dynamic parameters of a vehicle, in particular one or more of speed values;

acceleration values;

distance values;

protected fields:

warning fields;

and wherein the vehicle parameters can comprise one or more of the following parameters:

kinds and respective number of the automated guided vehicles in the environment, optionally with statistical and determined fluctuations;

number of non-automated guided vehicles and/or pedestrians in the environment, optionally with statistical and determined fluctuations;

preferred directions and/or preferred paths and/or preferred locations of the vehicles and/or pedestrians, optionally with statistical and determined fluctuations;

operating error probability (load falls off);

map error probability; and equipping the environment with active and/or passive navigation aids.

Dynamic parameters of a vehicle can be set top speed values, set top acceleration values (positive or negative-braking), distance values with respect to moving and non-moving objects during travel, and protected fields and warning fields.

It must be pointed out in this connection that different vehicles can drive autonomously in an environment. Different vehicles can have different parameters so that they also behave in a different simulated manner in the simulation.

Operator-driven vehicles and pedestrians/cyclists can also be included in the simulation by suitable parameters (in each case e.g. with a specific frequency, specific typical/atypical starting points and end points or trajectories therebetween).

The summary traffic parameters of the traffic to be simulated can comprise one or more of the following parameters: kinds and respective number of autonomously driving vehicles incl. statistical fluctuations and determined fluctuations (for instance dependent on the time of day), number of non-autonomously driving vehicles (that is operator-driven vehicles) and/or pedestrians in the environment, again optionally also with statistical and determined fluctuations (for instance, dependent on the time of day), preferred directions and/or preferred paths and/or preferred locations of the vehicles and/or pedestrians, again optionally with statistical and determined fluctuations, operating error probabilities (e.g. falling goods), map error probabilities, equipping of the environment with active and/or passive navigation aids.

The summary traffic parameters of the traffic to be simulated can comprise one or more of the following parameters:
vehicle kinds and their respective parameters;
number of vehicles, optionally over time;
preferred paths and/or locations; and
atypical trips.

The above-named parameters can be included in the simulation, then generate individual simulated traffic, and in each case then result in influences on the behavior of the dynamic objects (vehicles, pedestrians). This can in turn result in the occurrence of said events of interest that can then be counted and thus quantified.

At least some of said summary traffic parameters of the traffic to be simulated are set in accordance with real observations or real specified destinations for the real and mapped environment then to be simulated. Such real parameters can be vehicle kinds and their respective parameters, the number of respective vehicles, optionally, as mentioned, also fluctuating over time, preferred paths (frequently traveled paths), and/or locations frequently driven to, paths rarely driven, or locations rarely driven to. The simulation is set up such that these parameters aligned with reality are set/implemented so that the simulation result matches real circumstances well.

The simulation can also be macroscopically iterative such that after carrying out a first simulation part, simulation-relevant input values (parameters) are changed and a further simulation part is carried out on the basis of the changed values. The counting of events of interest then takes place separately for the simulation parts in each case. The count values belonging to the respective simulation parts are stored. The parameters underlying the respective simulations are also stored in an associable manner.

A typical scenario can be as follows, for instance: A simulation is run over a simulated year, for instance, using a first parameter set. Said simulation shows a comparatively high count value for critical situations. Safety-relevant parameters are then changed, for instance top speeds, distances, protected fields, warning fields, and similar. A simulation is run again on the basis of the changed parameter set. The change of the parameter sets can take place automatically according to predefined strategies or via any other input apparatus that e.g. enables a manual user intervention. To this extent, an input device can be provided to accept changed parameters or to initiate the changing of given parameters.

The change of the parameters and/or of the electronically usable representation may take place automatically, preferably in accordance with the already present count values, or takes place externally over an input interface.

On the other hand, it can result during the running of a simulation part that no relevant events of interest such as critical situations, property damage, or injuries to a person occur. If no statistically significant count values are produced after a sufficiently long simulation time of a part simulation with respect to events of interest, this can be taken as an abort criterion for this simulation part. A further simulation having changed parameters can then be initiated, for instance having higher permitted top speeds, smaller distances, smaller protected fields and/or warning fields, or similar. A check can then again be made whether count values with statistical significance are produced and if so, the count values can be used as an evaluation of the respective parameter set.

The repeated running of simulations with changed parameters can be carried out multiple times and a plurality of sets of count values can be produced in this manner. Some count values and characteristic values can therefore be determined for every simulation part and the parameters underlying a suitable simulation can be selected as suitable.

Vehicle parameters used for the simulation of the movement of a vehicle during the simulation can then in particular actually be used to equip and/or control the real vehicles in the real environment. This can take place for those vehicle parameters for which the resulting count values prove to be suitable. The simulation parameters decisive for this can then be taken as the characteristic values for the environment automatically trafficable by vehicles.

A further possibility of a change of parameters underlying the simulation is to change the electronic map. In the real image, this would correspond to a rearrangement of the imaged environment or is to be understood as a proposal therefor. Such modifications after the end of a simulation part and before the start of a further simulation part can also take place in response to a suitable input from an input device. This is preferably done in a copy of the electronic map since it is not clear that the environmental change that would correspond to the map change is meaningful. A simulation part is then run again with reference to the changed map. Changes to the electronic map can, for instance, mean that (as an example in FIG. 3) rack spacings are increased (in FIG. 3, for example, between 34a and 34b and/or between 34b and 34c) or that racks are reduced in size (for instance a left-to-right extent of the racks 34a and 34b in FIG. 3) and similar. The permitted area for the free store 35 can also be changed. If a simulation run on the basis of the electronic map changed in this manner produces satisfactory count values, the map change checked in this manner can be taken as the characteristic value for the environment autonomously trafficable by vehicles and can be understood as a proposal for a change of the real topology.

The observation of the count values can generally take place as to whether they are below or above a given threshold value and optionally also whether they are statistically significant. If a plurality of count values are recorded with respect to different kinds of events of interest, the can be observed or offset selectively and/or in a weighted manner. Count values with respect to critical situations and/or damage events (injuries to a person, property damage) can in particular be used as the sole evaluation criteria and/or can be given high weighting. As already stated, it is furthermore also possible in these checks to look at the derived values, for instance related/relative values, for instance related to a standard time period (for example a year) or related to a vehicle or related to a location or similar, instead of looking at the pure count values.

To the extent that, for instance "normal traffic" or "slow-moving traffic" or "traffic jam" are counted as events of interest, this can be converted into a relative time portion value (for instance 5 time % traffic jam, 17 time % slow-moving, rest normal. The focus can also be placed on the distance traveled instead of the time as the reference factor. Events such as a traffic jam, slow movement, and normal flow of traffic can be distinguished using speed threshold values that are checked if no other speed-restricting events (for instance loading activity) are present.

The characteristic values for an environment autonomously trafficable by vehicles are therefore determined with reference to the count result for the events of interest during the simulation (optionally a plurality of kinds of events of interest with respective count values). In the one case, for the abstract evaluation of an environment together with associated parameter sets, they can be the count values themselves or values derived therefrom such as the already named related values. In a further case, the characteristic values can be parameters on the basis of which a simulation was run with satisfactory count values, with the parameters then being able to be used for the actual vehicle control. In yet a further case, the characteristic values can be map changes that can be understood as proposals for a change in the environmental topology.

Simulation results are stored. The mutually associated data, in particular simulation parameters and count values, are stored in a manner associable with one another. The individual simulation steps themselves can also be stored for a later or parallel different evaluation. The storing takes place such that mutually associated data (in particular data of a simulation part) are stored in a manner associable with one another.

Considered from a technical calculation aspect, the simulation itself (simulation of the movement of the movable objects) can be carried out by one computer or by a plurality of networked computers, The detection and counting of events of interest can be carried out by the same (simulating) computers or by other computers that then access the outputs or stored values generated by the simulating computers.

A simulation or a simulation part can be aborted if either specific count values (in particular critical count values—critical situations or damage cases) exceed or fall below specific limits viewed in absolute or relative terms. It can also be aborted when no numbers of statistical significance are produced for the count values of interest after a specific simulated time period.

The repeated carrying out of individual simulations (that is the carrying out of a plurality of simulation parts) can be aborted if a predefined simulation sequence has been worked through or if satisfactory parameters/characteristic values have been found in a simulation part.

Events of interest for only one single vehicle can be detected and counted within a simulation part. They can, however, also be counted individually for every vehicle for a plurality of vehicles or cumulatively over this vehicle group. They can also be counted individually for all vehicles or cumulatively for all the simulated vehicles.

The counting of events of interest and/or the characteristic value determination can also take place in a spatially resolving manner. It can be a count that is carried out in parallel with other counts (for instance, vehicle related or cumulatively). For example, a (virtual) lattice of a suitable size (for example square with a 0.5 m lattice constant) can be placed over the electronic map and events of interest (for instance property damage, injuries to a person, traffic jam, slow movement) can be counted for each tile produced. Spatially resolved information on the quality and safety of the flow of traffic in the respectively observed tiles of the environment is produced in this manner. The totality of the spatially resolved information thus produced (optionally again as absolute count values or relatively/in relation as described above) can be understood as characteristic values for the environment autonomously trafficable by vehicles.

The simulation of the traffic can comprise temporary obstacles/static objects, for instance vehicles forming a traffic jam or broken down/defective vehicles or objects placed down according to plan (for instance in the free store 35 or objects projecting from the rack), in regions (36 in FIG. 3) that are a priori trafficable. The simulation can to this extent comprise it generating further simulated objects that are included in the simulation. Such generated objects can be included in the simulation with their sizes, their positions, and orientations together with their speeds 0. If, on the other hand, a placed object is removed again, the associated simulated object can be taken out of the simulation.

The invention can contribute to a faster definition of the fleet parameters of the vehicle fleet of an environment to be autonomously trafficked. As a rule, the situation occurs that, for example, a warehouse is to be equipped with a new transport system or parts thereof, for example with new transport vehicles, just when a switch has been made from conventional operation with operator-driven vehicles to autonomous operation, preferably with automated guided vehicles. Vehicle parameters can then be set and simulated in a simulation part and can be varied in following simulation parts. Parameters on traffic prevailing in reality observed in reality can also be determined and used in a simulation part.

The effect of the variants on the count values with respect to the events of interest is a measure for the quality of the (changed) parameter. Parameters can be varied in this manner and their effect on the total system can be evaluated. Suitable parameters can then be the basis of a real implementation.

The simulation may comprise the automatic generation of simulated trip jobs and the simulated carrying out of the commissioned trips.

The simulated job orders may make reference to predefined simulated job orders and may take place with reference to real observations.

Static objects may be produced in the environment and may optionally be removed again in a simulation or in a simulation part.

The detection and the counting of events of interest may take place during the simulation.

The determined characteristic values and simulation parameters and optionally also intermediate results of individual simulation steps may be stored in a manner associable with one another.

The invention also relates to a method of simulating traffic for an environment automatically trafficable by vehicles comprising the steps providing a spatially resolving, electronically usable representation of the environment;

providing parameters that describe properties of vehicles and summary properties of the traffic to be simulated in the environment; and simulating the traffic in the environment with reference to the electronically usable representation of the environment and with reference to the parameters provided, with provision being made that the providing of parameters that describe summary properties of the traffic to be simulated in the environment comprises the following steps:

detecting real parameters that summarily describe real traffic in a real environment; and deriving the parameters that describe summary properties of the traffic to be simulated in the environment from the real properties.

An apparatus for determining one or more characteristic values for an environment autonomously trafficable by vehicles has an interface to a spatially resolving, electronically usable representation of the environment, a store for storing parameters that describe the properties of vehicles and of the traffic in the environment, a simulation device for simulating the traffic in the environment with reference to the electronically usable representation of the environment and with reference to the parameters provided, a detection and counting apparatus for detecting events of interest and for counting same in the simulation, a determination device for determining the characteristic values with reference to the count result, and an output and storage device for outputting and/or storing the characteristic value.

The invention generally relates to an apparatus that may also be adapted for the carrying out of the indicated methods and to a computer or to a computer network and to suitable connection, input, output, and storage devices.

The above-described features should also be understood as applicable to and for the movement of a robot or of a robot arm as a vehicle in its environment.

Embodiments of the invention will be described in the following with reference to the drawings; there are shown.

Figure 1:
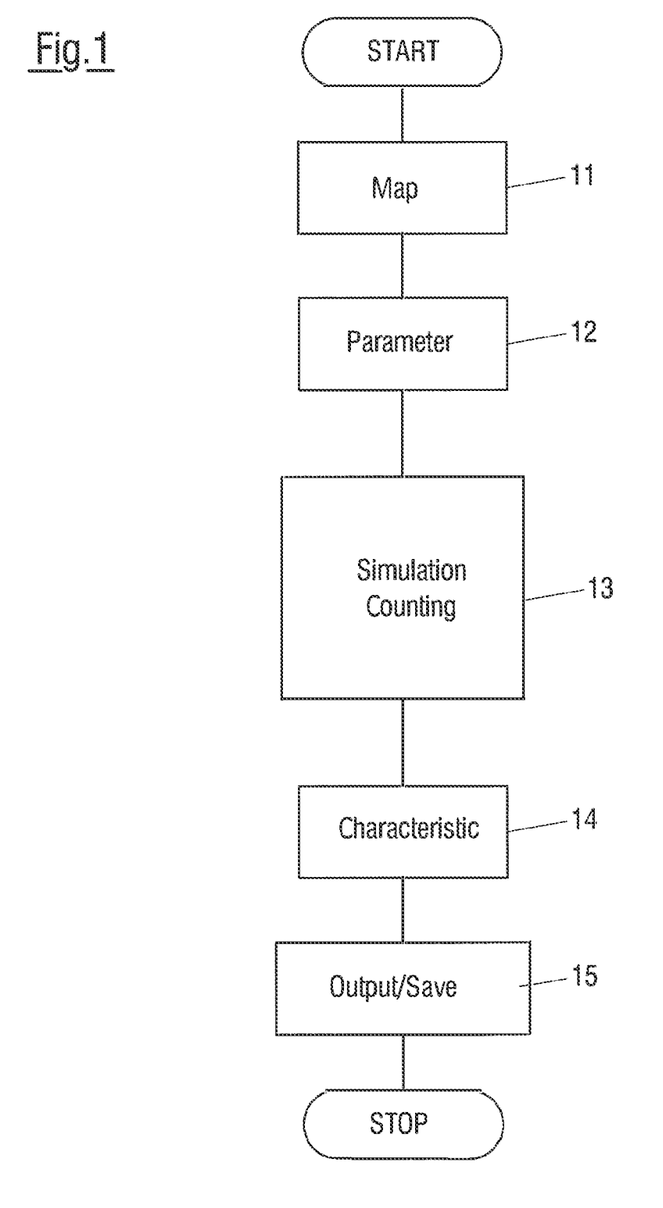
FIG. 1 generally, a method of determining characteristic values for an autonomously trafficable environment.

FIG. 1 schematically shows the method of determining one or more characteristic values for an environment autonomously trafficable by vehicles. In step 11, an electronically usable environmental representation is invoked or access thereto is established by the simulating components (computer, computer network). This can include a copy being made of the associated data.

In step 12, parameters are provided on the basis of which the simulation to be carried out should be performed. The parameters can comprise vehicle parameters and traffic parameters. Both can be based on or reflect real parameters or values observed in reality. The provision can take place by resetting/inputting and/or invoking and optionally changing stored values.

The simulation can generally comprise the simulated use of the mapped environment. Typical uses can be simulated in that they are recalculated along the time axis, preferably in a time discrete manner by recursive calculation. The calculation can perform the assumption of a starting state, the continued calculation of same into an end state after a specific time step according to relevant parameters, the evaluation of the end state, the adopting of the end state as a new starting state, and then repeating the continued calculation. The time step can be brief, e.g. less than 1 second, e.g. 0.2 seconds. One hour of net operation would then be simulated by 3,600×5=18,000 iterations.

The simulation comprises the occupying of the virtual mapped environment by virtual traffic that can, as described above, be recursively calculated. The virtual traffic can comprise a plurality (a large number) of virtual trips of a number (a large number) of virtual vehicles (incl. pedestrians, a bicycle, . . . ), with a trip being able to be defined as a movement between a starting point and an end point, optionally via one or more waypoints, optionally including stop points and stop times in the virtual environment. The specific path (trajectory) of the trip can also take place in the simulation along a predefined path or can be decided ad hoc by a suitable (preferably a really used) co-simulated navigation algorithm.

The occupation of the virtual mapped environment with virtual traffic takes place as close to reality as possible from a qualitative and quantitative aspect. The summary real partners characterizing the real traffic are reproduced as close to reality as possible. This initially comprises the summary real parameters characterizing the real traffic being defined, determined, and being provided as an electronically usable data collection. They can comprise statistical and absolute parameters, for instance one or more of the following parameters:

types and number of vehicles;

number of trips (per time and optionally per vehicle);

typical sets of starting points, end points, and stopping points of trips and optionally trajectories of these;

number of persons and their movements in the environment;

number of person-driven vehicles and their movements in the environment;

typical sets of starting points, end points, and stopping points of trips and optionally trajectories of these;

error probabilities in vehicles; and routing methods (e.g. remote controlled, autonomous), routing algorithm;

The parameters, that describe summary properties of the traffic to be simulated in the environment can qualitatively (by their type) and optionally also quantitatively correspond to the real parameters or can be qualitatively and/or quantitatively changed with respect to them.

The summary parameters characterizing the traffic to be simulated can be occupied with values close to reality in different manners, for instance observing and correspondingly evaluating and quantifying the real traffic in the real environment (if present), and taking over of these real parameters as the summary parameters of the traffic to be simulated;

observing and correspondingly evaluating and quantifying the real traffic in a different, preferably the same or a similar (of similar size, similarly occupied) real environment and optionally adapting and scaling these real parameters for generating the summary parameters of the traffic to be simulated; and combining the above measures.

If the real parameters describing reality are defined, determined, and electronically usably prepared, for instance stored in a database, they serve as the basis for determining the parameters, the summary properties of the traffic to be simulated in the environment, and they in turn serve for the generation of the specifically simulated traffic during the specific simulation in that uses, in particular trips (also operator-driven) and pedestrians, are simulated such that in the long term the simulated traffic shows the same or sufficiently similar parameters as those that were determined in reality.

The matching of the simulated traffic to the real traffic can, for example, take place in that travel jobs are generated in a suitable number, but with controlled probabilities, e.g. for starting points, end points, and stopping points, including stopping times, and are then carried out/calculated in a simulated manner. For example, a small set of travel jobs can be generated that corresponds to the statistical parameters and that is then used in a large number of cases until the desired total number is reached. In the repetitions, changes to the jobs can be carried out that are randomly scattered around the set values or are quasi-randomly controlled. The starting points in time of trips in accordance with travel jobs can also be varied.

The simulation of the use/trafficking of the automatically trafficable environment takes place in step 13. This can include the "populating" of the environment with the desired simulated traffic and said iteration/recursion with a large number of loops. The simulation comprises the inclusion of individual virtual trips and movements that can be defined as above in the virtual situation and the simulation of the movement of the autonomously navigating vehicles as well as also the simulation of the movement of other dynamic objects, for instance pedestrians, cyclists, and operator-driven vehicles. The trips and movements can be generated in accordance with the deviation of the parameters of the simulated traffic from the real parameters to move the former to the latter.

In the actual simulation, the dynamic objects are not each individually simulated per se only with reference to the mapped environment, but also with reference to one another to be able to simulate effects such as traffic jams, priority, errors, etc. The simulation can also comprise the taking into account of temporary static objects, for instance a broken-down vehicle or an object placed down.

It can also be the aim of the simulation to simulate parameters that are modified with respect to reality. This can relate to parameters of the vehicles and/or traffic parameters. A modification algorithm can also be provided here that modifies vehicle parameters and/or parameters in accordance with predefined criteria to form summary properties of the virtual traffic that are then used as the basis for the following simulation part. The traffic density (trips/movements per time) or the top speed of vehicles can thus, for example, be modified and these modified summary properties of the virtual traffic are then used as the basis for the further simulation.

Events of interest are detected and counted simultaneously with the simulation or after it. A plurality of kinds of events of interest can be defined and can be counted separately. The simulation also comprises the checking of abort criteria of a simulation (of a simulation part) or of a sequence of simulation parts. Abort criteria can be count values and/or time values (simulated time).

The determining of the characteristic values takes place in step 14 by reference to the counter results on the counting of events of interest. In this process, the count values can be used directly (optionally selectively) or relatively with reference to a reference value for determining the characteristic value or the characteristic values or simulation parameters or values derived therefrom can be used as characteristic values and the count values serve as an abort criterion for a simulation/a simulation part or as an evaluation of the respective parameters used as characteristic values.

Parameters that were provided in step 112 can in particular be taken as the desired characteristic values in step 14 or, starting from the parameters provided in step 12, different parameters than the desired characteristic values can be determined.

If a plurality of simulation parts are run, count values can be generated separately for each part and optionally characteristic values can also be determined with reference thereto. A plurality of sets of count values and optionally of characteristic values are then produced from which e.g. ultimately a matching one can be looked for, for instance in accordance with the count values.

The outputting and/or storing of the characteristic values takes place in step 15. The output can be an output to a storage device or to a display device or also the transmission of specific data over a network.

Figure 2:
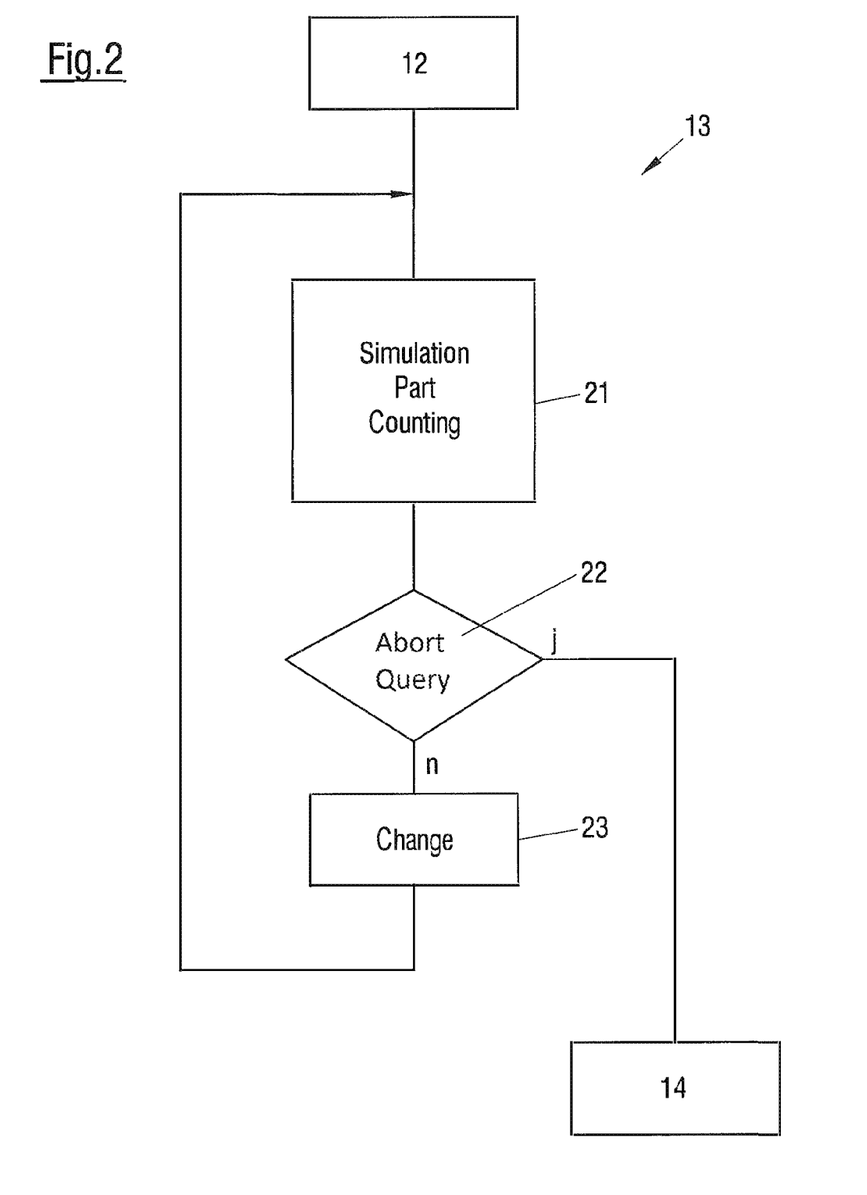
FIG. 2 an option of the method of FIG. 1.

FIG. 2 shows an embodiment of FIG. 1. It in particular shows a configuration of the simulation to be carried out in step 13 of FIG. 1. After the provision of the map and of the parameters in step 12, a first recursive/iterative simulation part 21 is carried out that is per se a complete simulation. On the occurrence of an abort criterion (now shown), the simulation is ended. The ending of the recognition and of the counting of the events of interest then also takes place.

A check is then made in step 22 whether a further simulation part should be carried out or not. This can be understood as an abort criterion for the total simulation (consisting of a plurality of part simulations). If a decision of "Yes" is made here, the process is continued with the characteristic value determination in step 14. If in contrast as decision of "No" is made, parameters can be changed in step 23 (in particular those that were previously acquired in step 12) and/or map data can be changed (in particular those that were previously acquired in step 11). A further simulation part 21 for which events of interest are separately detected and counted can then be carried out with reference to the thus changed parameters and/or map data. If an abort criterion (not shown) is again reached here, count values and optionally other data are in turn stored in an associable manner in this simulation part and a check is again made in step 22 whether a further simulation part is to be carried out.

The abort decision in step 22 can take place with reference to the count values in the preceding simulation part 21 or can be made using predefined criteria. It can also be made in accordance with data on an input device.

FIG. 3 shows the topology to be simulated already initially described. At least its fixed elements are shown by an electronically usable representation. A stationary computer is shown by 30 in FIG. 3 that can be provided in the sense of a server and that is suitably connected to required system components (other computers, vehicles, stationary sensors, etc.) either in a wired manner or wirelessly to the vehicles 32 (wireless LAN, WiFi, NFC, DECT, Bluetooth or similar). The system architecture can to this extent be a server-client structure or a peer-to-peer structure or a mixed form. The structure of the system present in reality, including its real consequences (communication and its failure or delay, component defects, and similar) are co-simulated in steps 13 and 21 respectively.

Figure 5:
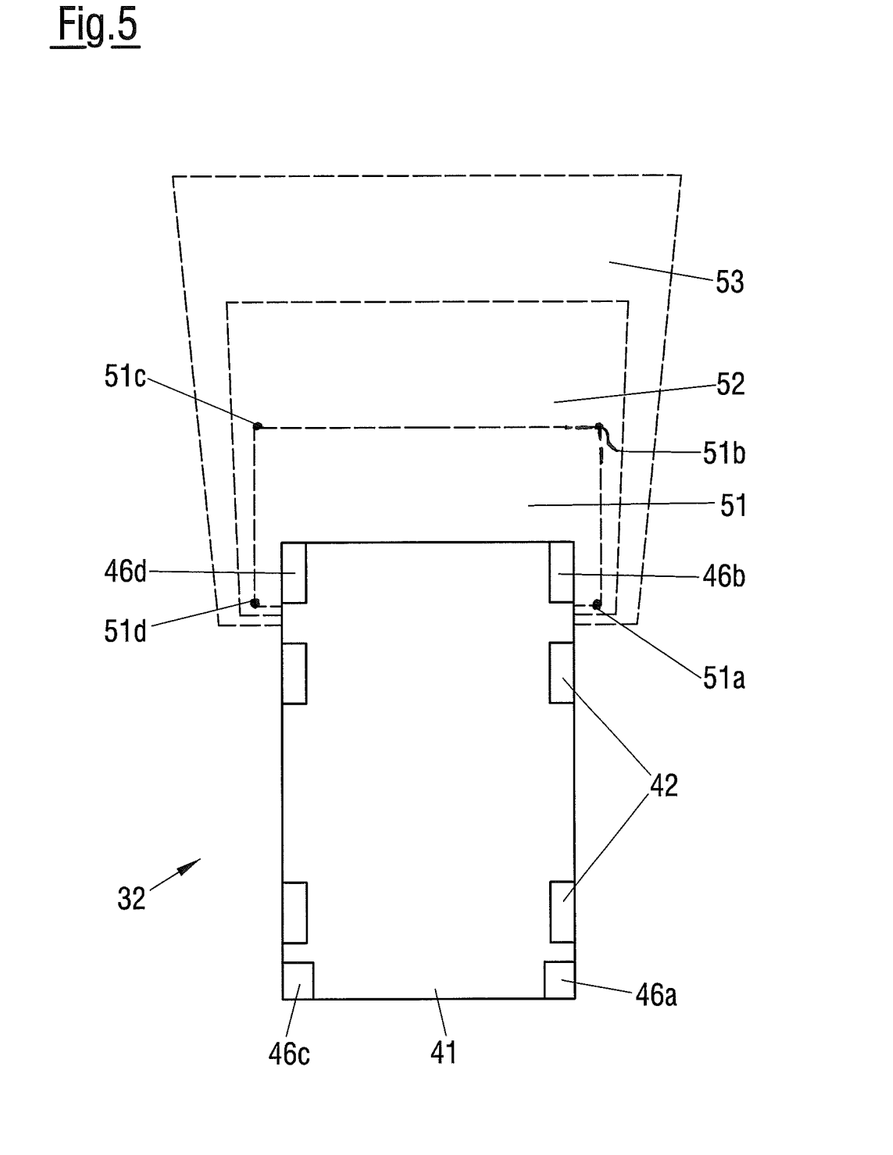
FIG. 5 a vehicle in a plan view with protected fields and warning fields.

FIG. 5 schematically shows an autonomously navigating vehicle 32 in a plan view. 42 are its wheels, 41 is the vehicle body. It is assumed it is (at least instantaneously) at the front in the direction of travel at the top in FIG. 5. One or more protected fields 51 or warning fields 52, 53 that are monitored (preferably within the vehicle) can be defined relative to a vehicle for the environment of the vehicle. It is in particular monitored whether objects are required according to plan or unplanned in one of the protected fields or warning fields. Different measures can be taken depending on the detection result.

Sensors are marked by 46 by means of which the environment can be scanned and can be checked for the presence of objects two-dimensionally (typically in one plane) or three-dimensionally (sphere or hemisphere) in an angular and distance resolving manner. They can here be the already named LIDAR, LADAR, or RADAR sensors. They can, however, also be stereoscopic image-processing sensors or similar It is finally also conceivable that the environmental detection, including the protected fields and warning fields 51, 52, 53, are monitored from the outside (stationary sensors 39). The sensors shown can be redundant or an complement one another, for instance cover different spatial regions (with little overlap).

FIG. 5 shows an example in which three protected zones 51, 52, 53 nestled in one another are defined relative to the vehicle 32. The inner zone 51 is a protected field; 52 and 53 are warning fields. They are here the technical data definitions of virtual regions that are used in the check. The zones extend differently far to the front viewed in the direction of travel. In the example shown they are shown as defined approximately as right-angled. They can then, for example, be defined by corner points 51a, 51b-51c, and 51d of the protected field 51, with the edges thus defined defining the protected field. The same applies in a similar manner to the further extending warning fields 52 and 53.

If objects are recognized in a warning field, this can result in measures such as emitting a report, outputting an alarm perceptible to humans or speed reduction. If an object is recognized in a protected field, this can result in a complete stop, with a strong braking and further measures such as emitting a report and outputting an alarm perceptible to humans.

The vehicles to be simulated in the described simulations have protected field definitions and warning field definitions like real vehicles. They are simulated together with their checking and evaluation and the consequences drawn. Depending on the detection result of the sensors 46 together with the subsequent evaluation, results can be present to the extent that no object was recognized in any of the protected/warning fields or that an object was recognized in one of the warning fields (53 for instance) or in a plurality of warning fields (52, that is also in 53). This does not have to be an error. It can occur according to plan on an approach to a rack that the vehicle 32 pushes the smaller warning field 52 onto the rack location. To this extent, the check of the warning fields 52, 53 includes whether the presence detection of an object is according to plan or not. The simulation also includes this. The arising of crushing points as described further above can also be monitored and counted in the simulation.

Consequences are drawn depending on whether and if so where the presence of an object was recognized. On a presence according to plan (e.g. approaching a rack), the plan can be continued, for example. On a non-planned presence, different measures can be taken, for instance an alarm on a presence only in the outermost warning field 53; an alarm and deceleration on a presence in the middle warning field 52; and a complete braking on a non-planned presence in the inner protected field 51. Such consequences are also simulated.

The definition of the protected fields and warning fields (for instance using their corners 51a to 51d) can be some of the parameters that are provided in step 12 of the Figure for the simulation to be carried out. The fixing of protected field definitions (for instance coordinates of the corners 51a to 51d) can be the subject of the parameter change in steps 23 of FIG. 2.

Definitions of protected fields and warning fields that were used in a simulation or in a simulation part can be the subject of the characteristic value determination in step 14. Definitions of protected fields and warning fields (for instance corner coordinate indications as shown in FIG. 5) can then in particular be used as real parameters in real vehicles.

Planned and/or non-planned infringements of protected fields and warning fields 51-53 can be defined and counted as events of interest, optionally separately for different protected/warning fields.

Reference is made here to the fact that, as already stated, different vehicles that can then also have different definitions of protected fields and warning fields can drive autonomously in an environment. To this extend, optionally different parameter sets than the desired characteristic values are then also generated, stored, and output.

The defining of protected fields and warning fields for autonomously navigating vehicles has previously taken place manually and is a laborious and time consuming task that has previously been carried out on the basis of empirical values. In contrast with this, a parameter set that has been recognized as suitable after a simulation or simulation part can be used for real vehicles using the method described so that the generation of definitions for protected fields and warning fields is greatly accelerated. The system design can be such that definitions of protected fields and warning fields that were recognized as suitable in the simulation are shaped into a suitable data formatting (if they are not already present in this formatting) to be usable in real vehicles and can further comprise the data formatted in this manner being transmitted to suitable receivers, for instance to specific servers and/or to the real vehicles with respect to those that were simulated, and then being used there.

Instead of or in addition to the definition of protected fields and warning fields, different equipment parameters of the vehicle than the desired characteristic values can be determined (and optionally set as simulation parameters beforehand), for instance control parameters such as top speeds and accelerations, hardware parameters such as sensor quality (resolution), number of sensors, and sensor redundancy, and similar.

The different equipment parameters of the vehicle may include one or more of sensor system properties, optionally with sensor system defect probabilities; actuator system properties, optionally with actuator system defect probabilities; control properties, optionally with control probabilities, and communication properties, optionally with communication defect probabilities.

All the relevant data can then also be stored in a suitably associable manner for documentation purposes. This can also be relevant with respect to legal considerations (operating license, insurance coverage, forensic evidence, etc.). Characteristic values in particular determined in step 14 are stored, where possible also map data acquired in step 11 and/or parameter data acquired in step 12, and where possible also individual steps of a simulation or of a simulation part.

The traffic in the observed environment to be simulated can be generated in accordance with real observations. The number of the vehicles and persons in the environment, their frequency of use, trajectories, error phenomena, and similar are relevant here. Simulated jobs can be generated for the traffic simulation that in turn result in simulated trips. The simulated jobs can be taken from a catalogue of sample simulation jobs. They can optionally be statistically varied. Trips to fulfil the jobs are then simulated in the environment in accordance with the simulated jobs. To this extent, a simulated trip can comprise a route of an autonomously navigable vehicle from the entry of the vehicle into the observed environment up to the departure of the vehicle from the environment. The simulated jobs or trips are set such that empirically determined values or forecast values are observed. This can also comprise statistical fluctuations and determined fluctuations, for instance different traffic densities in dependence on the time of day (night, lunch break, . . . ). The simulation not only comprises the simulation of the autonomously navigating vehicles, but also the simulation of operator-driven vehicles and of persons. The latter are also introduced into the simulation in a manner as close to reality as possible.

The generation and/or the modification of a virtual job can to this extent also be an event of interest to be counted since they characterize the traffic. A job change can result, for instance, due to a traffic jam or an inaccessibility of specific environmental regions. Such plan changes can also be understood and counted as events of interest.

Figure 6:
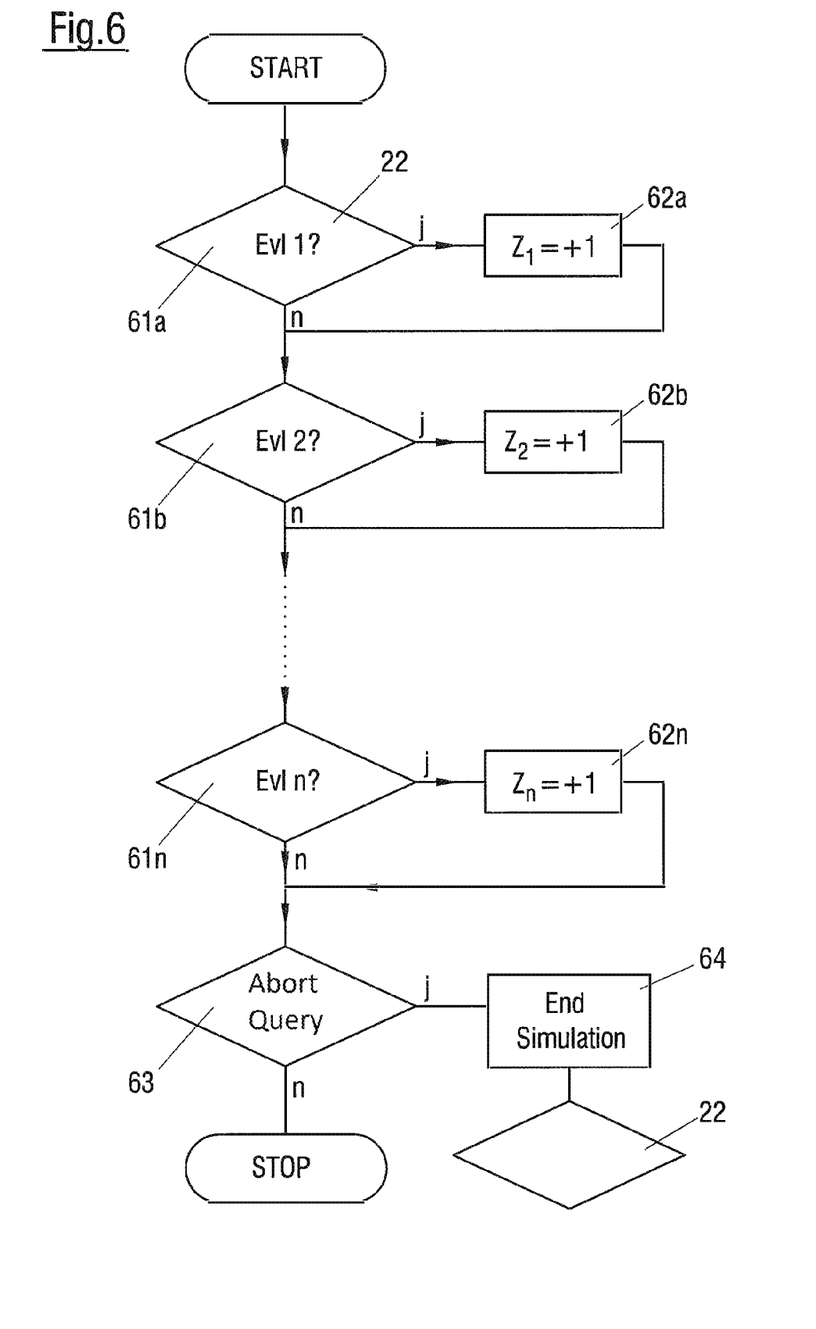
FIG. 6 the detection and counting of events of interest.

FIG. 6 schematically shows the detection of events of interest and the counting of same. It is assumed that n different kinds of interest ("EvI") are checked, that is EVI1, EVI2, . . . EVIn. These events are each individually checked in a series of queries 61*a*, 6B, . . . , 61*n*. Every single check can be preceded by more complex evaluations, for instance a collision check of vehicle and human or of vehicle and article, protected/warning field infringement, speed check, and similar. A separate counter Z is kept for every kind of event of interest (that is counters $Z_1, Z_2, \ldots Z_n$ in steps 61*a*, 62*b*, . . . , 62). If the respective associated event was recognized ("Yes" in query 61), the associated counter is incremented in step 62. When all the events of interest have been queried, the method shown ends.

The method of FIG. 6 can be carried out after every single simulation step or after a respective plurality of individual simulation steps (e.g. simulated every second). Since the presence of an event of interest does not necessarily preclude another, if this non-exclusion is the case, the flow is moved back into the query flow after the increment of a counter. Otherwise, precluded queries can be skipped or the end of the process is skipped to. If only one kind of event of interest is defined, the process accordingly only has one query.

A further query 63 with respect to an abort criterion can take place at the end of the query sequence 61*a* to 61*n*. It is a different one than the query 22 in FIG. 2. The latter asks whether a further simulation is to be carried out or not, while query 63 in FIG. 6 checks whether a specific simulation (simulation part) that is just running is to be aborted. The query 63 can, for example, evaluate the different counter counts and/or can observe simulated or real run times of the simulation. If one of these criteria produces the aborting of a simulation, the specific simulation is aborted and administratively ended (step 64, for instance data storage and similar). A skip to step 22 of FIG. 2 can then take place. If the simulation is in contrast not aborted ("No" in 63), the simulation is continued in a further simulation step.

To the extent that abstract characteristic values of an automatically trafficable environment are determined as characteristic values, they can be produced from a single one of the count values, for instance from a count value relating to injury to a person, or from a plurality of selected count values, for instance with respect to injuries to a person, property damage, and optionally also to critical situations. In general terms, a plurality of counter counts on a plurality of kinds of events of interest can be offset against one another, in particular added, with the addition being able to take place in weighted form. A count value with respect to injuries to a person can have a high weight; a count value with respect to property damage a lower weight, etc.

Figure 7:
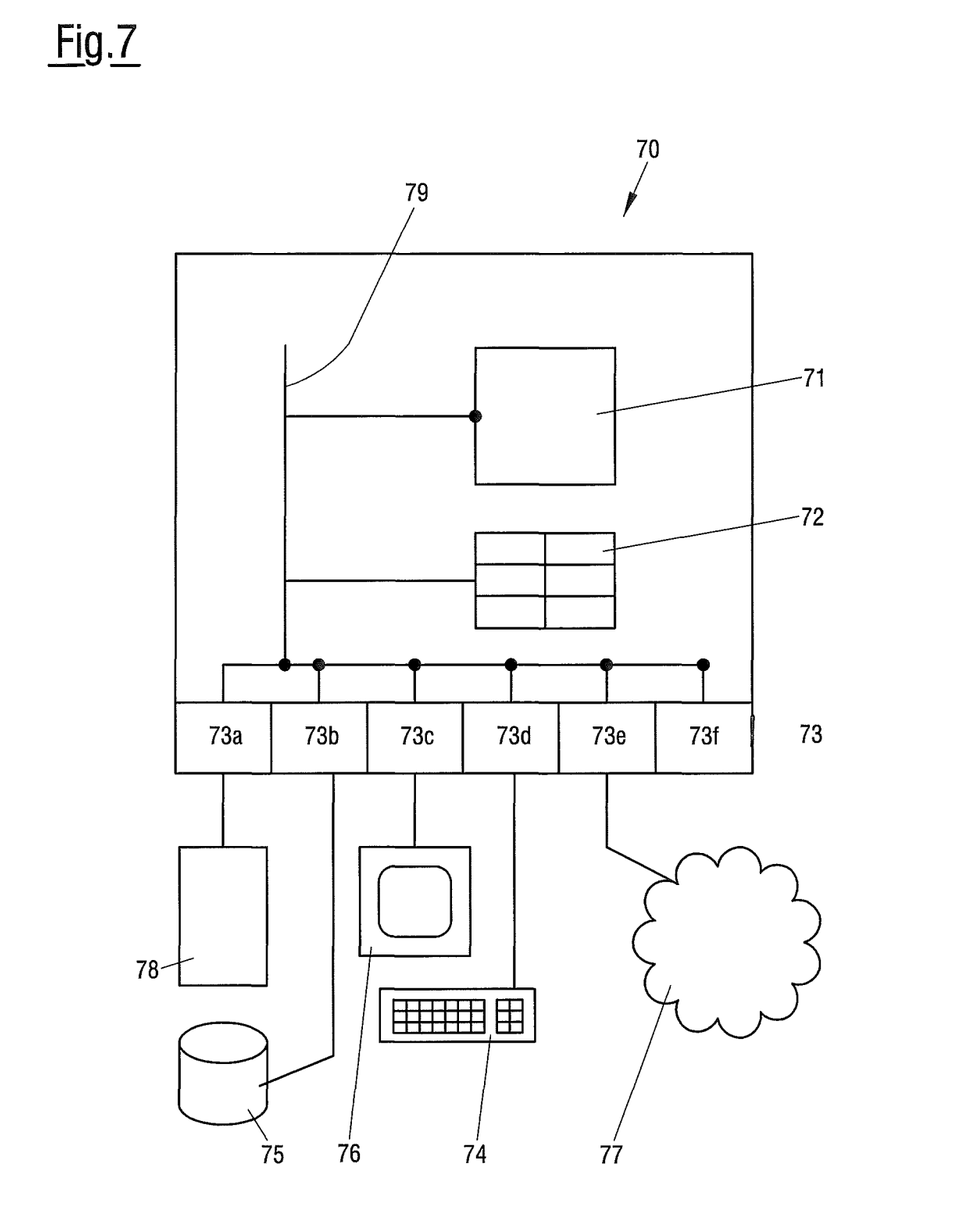
FIG. 7 a simulation apparatus.

An apparatus 70 for carrying out the method is schematically shown in FIG. 7. It can have a computer or (not shown) a computer network that carries out and implements the required steps. Connection or interfaces 73 to the required data sources (for instance apparatus 78 with interface 73*a* with map data) to the extent they are not internally present and can also have input devices, e.g. a keyboard 74 with interface 73*d* or an external memory link 75 with interface 73*b* for external inputs, for instance for the parameter sets. A screen 76 with interface 73*e* can be provided.

The simulation itself and the detection and counting of events of interest and the determining of the characteristic values can take place in one or more devices 71 (processing units). The apparatus can also comprise wired or wireless interfaces 73*e*, 73*f* for acquiring or outputting data over networks, for instance the internet 77. It has an internal memory 72 with different zones (non-volatile, volatile, data, programs). The internal connections take place using a bus 79 or similar if an individual computer is affected, otherwise (not shown), for example, over LAN or wireless LAN or similar.

The subject of the invention may also be a data carrier having data thereon that represent executable code that when executed implements the process described herein.

As already stated, the above-described features should also be understood as applicable to and for the movement of a robot or of a robot arm as a vehicle in its environment. They can, however, also be understood more narrowly as only applicable to the situation of automated guided vehicles in an environment, for instance a warehouse.

In the present description, features should also be understood as combinable with one another when their combination is not explicitly described as long as the combination is technically possible. Features that are described in a specific context or in a Figure or in a claim or in an embodiment should also be understood as separable from this context, this Figure, this claim, or this embodiment and should be understood as combinable with one another as long as the combination is technically possible. Descriptions of method steps should also be understood as a description of the product produced therewith, and vice versa.

REFERENCE NUMERAL LIST

11 providing map data
12 providing parameter data
13 simulation, recognition, counting
14 characteristic value determination
15 output, storage
21 simulation part
22 abort query 23 parameter change
30 stationary computer
31a-c persons
32a-d autonomously navigating vehicle
33 operator-driven vehicle
34a-d racks
35 free storage
36 trafficable zone
37a,b door
38a,b door
39 stationary navigation aids
41 vehicle body
42 wheels
43 control
44 drive
45 brakes
46a-d sensors
47 communication interface
51 protected field
51a-d corner points
52-53 warning fields
61a-n queries
62a-n increments
63 abort query

The invention claimed is:

1. A method of determining one or more characteristic values for an environment autonomously trafficable by vehicles, the method comprising the steps of:
providing a spatially resolving, electronically usable representation of the environment;
providing parameters that describe properties of vehicles and summary properties of traffic to be simulated in the environment;
simulating the traffic in the environment with reference to the electronically usable representation of the environment and with reference to the parameters provided;
in the simulation, detecting events of interest and counting the detected events of interest;
determining the one or more characteristic values with reference to the count result; and
outputting and/or storing the one or more characteristic values,
wherein the one or more characteristic values comprise one or more vehicle parameters of a vehicle driving autonomously in the environment, the one or more vehicle parameters of the vehicle being determined with reference to the count result,
wherein the one or more characteristic values further comprise one or more protected fields and/or warning fields around the vehicle, and
wherein the detected events of interest comprise detected violations of the one or more protected fields and/or warning fields around the vehicle.

2. The method in accordance with claim 1, in which the one or more characteristic values further comprises/comprise one or more evaluation numbers and/or evaluation parameters of the environment that are determined with reference to the count values.

3. The method in accordance with claim 1, in which the one or more characteristic values further comprise equipment parameters of the vehicle.

4. The method in accordance with claim 1, in which the one or more characteristic values is/are or comprises/comprise one or more changes of the electronically usable representation of the environment.

5. The method in accordance with claim 1, in which the parameters provided for the simulation comprise selectable vehicle parameters and settable summary traffic parameters.

6. The method in accordance with claim 5, in which at least some of the summary traffic parameters are set in accordance with real observations in the real environment.

7. The method in accordance with claim 1, in which after a first simulation part having a first parameter set its count values are stored and a second simulation part having a second parameter set is carried out with a separate event counting, wherein one or more of the parameters in the second parameter set are changed with respect to those in the first set, wherein after the second simulation part its count values are also stored, and wherein the one or more characteristic values are determined with reference to the stored count values of the simulation parts.

8. The method in accordance with claim 1, in which after a first simulation part its count values are stored and a second simulation part is carried out on the basis of a changed electronically usable representation of the environment with a separate event counting, wherein after the second simulation part its count values are also stored, and wherein the one or more characteristic values are determined with reference to the stored count values of the simulation parts.

9. The method in accordance with claim 7, in which the change of the parameters of the electronically usable representation takes place automatically or takes place externally over an input interface.

10. The method in accordance with claim 1, in which after a simulation or after a simulation part the underlying parameters are stored in a manner associable with the associated count values.

11. The method in accordance with claim 1, in which the simulation is ended when a count value has exceeded a specific threshold or when the simulation has simulated a specific time duration.

12. The method in accordance with claim 1, in which a plurality kinds of events of interest are defined and the counting of the events of interest takes place separately for each of the kinds.

13. The method in accordance with claim 1, in which the counting of events of interest takes place in an event controlled or time controlled or route controlled or position controlled manner.

14. The method in accordance with claim 1, in which the counting of events of interest is carried out for a single simulated vehicle or distinguishably for a plurality or for all of the simulated vehicles or globally for a plurality or for all of the simulated vehicles.

15. The method in accordance with claim 1, in which the detection and the counting of events of interest and the determination of the one or more characteristic values takes place in a spatially resolving manner.

16. The method in accordance with claim 1, in which operator-driven vehicles and/or pedestrians are also simulated with reference to respective parameter sets in the simulation.

17. An apparatus for determining one or more characteristic values for an environment autonomously trafficable by vehicles comprising:
an interface to an apparatus for a spatially resolving, electronically usable representation of the environment;
a store for storing parameters that describe properties of vehicles and of traffic in the environment;

a simulation device for simulating the traffic in the environment with reference to the electronically usable representation of the environment and with reference to the parameters provided;

a detection and counting apparatus for detecting events of interest and for counting the detected events of interest in the simulation;

a determination device for determining the one or more characteristic values with reference to the count result; and an output and storing device for outputting and/or storing the one or more characteristic values, wherein the one or more characteristic values comprise one or more vehicle parameters of a vehicle driving autonomously in the environment, the one or more vehicle parameters of the vehicle being determined with reference to the count result, wherein the one or more characteristic values further comprise one or more protected fields and/or warning fields around the vehicle, and wherein the detected events of interest comprise detected violations of the one or more protected fields and/or warning fields around the vehicle.

18. A method of determining one or more characteristic values for an environment autonomously trafficable by vehicles, the method comprising the steps of:

providing a spatially resolving, electronically usable representation of the environment;

providing parameters that describe properties of vehicles and summary properties of traffic to be simulated in the environment;

simulating the traffic in the environment with reference to the electronically usable representation of the environment and with reference to the parameters provided;

in the simulation, detecting events of interest and counting the detected events of interest;

determining the one or more characteristic values with reference to the count result; and outputting and/or storing the one or more characteristic values, wherein the one or more characteristic values comprise one or more evaluation numbers and/or evaluation parameters of the environment that are determined with reference to the count result, wherein the one or more characteristic values further comprise one or more protected fields and/or warning fields around a vehicle driving autonomously within the environment, and wherein the detected events of interest comprise detected violations of the one or more protected fields and/or warning fields around the vehicle.

19. An apparatus for determining one or more characteristic values for an environment autonomously trafficable by vehicles comprising:

an interface to an apparatus for a spatially resolving, electronically usable representation of the environment;

a store for storing parameters that describe properties of vehicles and of traffic in the environment;

a simulation device for simulating the traffic in the environment with reference to the electronically usable representation of the environment and with reference to the parameters provided;

a detection and counting apparatus for detecting events of interest and for counting the detected events of interest in the simulation;

a determination device for determining the one or more characteristic values with reference to the count result; and an output and storing device for outputting and/or storing the one or more characteristic values, wherein the one or more characteristic values comprise one or more evaluation numbers and/or evaluation parameters of the environment that are determined with reference to the count result, wherein the one or more characteristic values further comprise one or more protected fields and/or warning fields around a vehicle driving autonomously within the environment, and wherein the detected events of interest comprise detected violations of the one or more protected fields and/or warning fields around the vehicle.

* * * * *